United States Patent [19]

Isobe

[11] Patent Number: 5,512,512

[45] Date of Patent: Apr. 30, 1996

[54] CONTACT HOLE FILLING IN A SEMICONDUCTOR DEVICE BY IRRADIATION WITH PLASMA OF INERT GAS IONS

[75] Inventor: Akira Isobe, Tokyo, Japan

[73] Assignee: NEC Corporation, Tokyo, Japan

[21] Appl. No.: 159,227

[22] Filed: Nov. 30, 1993

[30] Foreign Application Priority Data

Nov. 30, 1992 [JP] Japan .................................. 4-319551

[51] Int. Cl.$^6$ ................................................. H01L 21/44
[52] U.S. Cl. ............................................. 437/187; 437/194
[58] Field of Search .................................. 437/203, 187, 437/194; 118/723 MR, 723 MA

[56] References Cited

U.S. PATENT DOCUMENTS

| | | | |
|---|---|---|---|
| 5,071,791 | 12/1991 | Inoue et al. | 437/203 |
| 5,081,064 | 1/1992 | Inoue et al. | 437/190 |
| 5,108,951 | 4/1992 | Chen et al. | 437/187 |
| 5,279,669 | 1/1994 | Lee | 118/723 MR |
| 5,453,305 | 9/1995 | Lee | 427/562 |

FOREIGN PATENT DOCUMENTS

| | | |
|---|---|---|
| 0202572 | 11/1986 | European Pat. Off. . |
| 0251523 | 1/1988 | European Pat. Off. . |
| 0401688 | 12/1990 | European Pat. Off. . |
| 0634063 | 1/1988 | Japan . |
| 2245596 | 1/1992 | United Kingdom . |

OTHER PUBLICATIONS

M. E. Day et al. "Low energy ion etching of aluminum oxide films" J. Appl. Phys. (Dec. 1992) v. 74 No. 11 pp. 5467–5470 (abstract).

C. S. Park et al., "Al–Plaph (Aluminum–Planarization by Post–Heating) . . . Metal CMOS Application", Proceedings of the Eighth VLSI Multilevel Interconnection Conference 1991, pp. 326–328.

*Primary Examiner*—George Fourson
*Assistant Examiner*—C. Everhart
*Attorney, Agent, or Firm*—Sughrue, Mion, Zinn, Macpeak & Seas

[57] ABSTRACT

In order to fill contact holes (43) formed in an isolation layer (41) laid on a semiconductor substrate (13) and having a principal surface and sidewalls defining the contact holes with aluminum of a covering material which is sputter deposited in a sputter chamber to lay a covering film (47) on the principal surface and on the sidewalls, the covering film is brought into contact with an inert gas atmosphere in a reflow chamber and is subjected to irradiation by plasma of inert gas ions for removal of an aluminium oxide film (49) undesiredly formed on the covering film and, either subsequently by application of heat to the substrate or simultaneously by the irradiation, for reflow of aluminium of the covering material into the contact holes to provide a conductor film (51) covering the principal surface and filling the contact holes. Preferably, the plasma is given small ion energy of 30 to 50 eV and a high ion density.

12 Claims, 4 Drawing Sheets

CONTACT HOLE FILLING IN A SEMICONDUCTOR DEVICE BY IRRADIATION WITH PLASMA OF INERT GAS IONS

BACKGROUND OF THE INVENTION

This invention relates to a method of filling contact holes with aluminium for an interlayer isolation layer of a semiconductor device and additionally to apparatus for implementing the method.

A semiconductor device comprises a semiconductor substrate and an interlayer isolation or insulation layer laid on the substrate for wirings in the semiconductor device. The isolation layer has an exposed principal surface and sidewalls extended from the principal surface into the isolation layer to define the contact holes. In order to provide the wirings, a conductor film is spread on the principal surface to fill the contact holes. In general, the conductor film is made of an aluminium material consisting essentially of aluminium. The aluminium material may be a known aluminium alloy including small amounts of silicon and copper.

Various methods of spreading such a conductor or aluminium film on the principal surface to fill the contact holes are already in practical use. Examples are a bias sputter method, a high temperature sputter method, and a reflow after sputter method.

The bias sputter method comprises the steps of depositing by sputtering the aluminium material film on the principal surface in a processing chamber and of simultaneously supplying a high frequency voltage to the substrate to ionize argon gas filled in the processing chamber into argon ions. Generated argon ions etch the deposited aluminium, and the aluminium film reflows into the contact holes to fill with aluminium masses. Inasmuch as the aluminium material is sputter deposited simultanesouly with sputter etch of the aluminium film, the argon ions are taken into the conductor film as impurities. As a consequence, the conductor film has a degraded film nature, a deteriorated electromigration resistance, a morphologically objectionable planar surface, an undesirable workability, and a poor alignment.

The high temperature sputter method comprises the steps of depositing by sputtering the aluminium material film and of simultaneously heating the substrate by a heater to a high temperature for reflow the aluminium material film to provide the conductor film. In accordance with the high temperature sputter method, it is possible to keep the argon ions out of the conductor film and to avoid consequent degradation of the film nature. The aluminium material is, however, sputter deposited at the high temperature. As a result, oxygen and water vapour are taken from an atmosphere of sputter deposition into the covering film and consequently into the conductor film to give the morphologically objectionable planar surface to the conductor film. Furthermore, temperature control is difficult during the sputter deposition and is hardly reproducible.

It is belivered by the present inventor that the reflow after sputter method is far more advantageous than the bias sputter and the high temperature sputter methods. An excellent reflow after sputter method is revealed in a paper contributed by C. S. Park and five others to the proceedings Eighth VLSI Multilevel Interconnection Conference, 1991, pages 326 to 328, under the title of "Al-PLAPH (Aluminium-Planarization by Post-Heating) Process for Planarized Double Metal CMOS Applications".

In the manner which will later be described in greater detail, the process is a hole fill method of filling contact holes formed in an interlayer isolation layer laid on a substrate or a semiconductor device and having a principal surface and sidewalls defining the contact holes. The process comprises the steps of laying on the principal surface and on the sidewalls a covering film of a covering material consisting essentially of aluminium and of heating the covering film for reflow of aluminium of the covering material into the contact holes to spread a conductor film covering the principal surface and filling the contact holes. The covering film is laid by sputter deposition of the covering material in a sputter chamber. The covering film is heated in a reflow or annealing chamber. The substrate with the covering film on the isolation layer must therefore be transferred from the sputter chamber to the reflow chamber. Usually, a barrier metal film is preliminarily sputter deposited on the principal surface and on the sidewalls before sputter deposition of the covering film thereon.

In connection with the reflow after sputter method, it has been confirmed by the instant inventor that an aluminium oxide film is undesiredly formed along an outside surface of the covering film even if the substrate with the covering film is transferred from the sputter chamber into the reflow chamber through vacuum. The aluminium oxide film deteriorates reflow of aluminium of the covering material into the contact holes. It is possible to improve the reflow by heating the substrate to a high temperature. Use of the high temperature, however, gives rise to an objectionable chemical reaction through the barrier metal film between the covering film and a diffusion layer below the aluminium masses filling the contact holes. The chemical reaction, in turn, results in aluminium spikes to give rise to junction leakage currents. This adversely affects reliability and yield of the semiconductor device.

SUMMARY OF THE INVENTION

It is consequently an object of the present invention to provide a hole fill method which is of the type of a reflow after sputter method known in the art and which is capable of excellently filling contact holes formed in an interlayer isolation layer laid on a substrate of a semiconductor device.

It is another object of this invention to provide a hole fill method which is of the type described and which is capable of removing an aluminium oxide film undesirably formed on a covering film laid on the isolation layer during progress of the hole fill method.

It is still another object of this invention to provide a hole fill method which is of the type described to spread a conductor film covering the isolation layer and filling the contact holes and which is capable of preventing junction leakage from taking place between the conductor film and an underlying diffusion layer of the semiconductor device.

It is yet another object of this invention to provide a hole fill method which is of the type described and which is capable of giving a high reliability and an excellent yield to semiconductor devices manufactured by using the conductor film.

Other objects of this invention will become clear as the description proceeds.

On setting forth the gist of this invention, it is possible to understand that a hole fill method is for filling contact holes formed in an interlayer isolation layer laid on a substrate of a semiconductor device and having a principal surface and sidewalls defining the contact holes and includes the steps of laying on the principal surface and on the sidewalls a covering film of a covering material consisting essentially of aluminium and of heating the covering film for reflow of aluminium of the covering material into the contact holes to spread a conductor film covering the principal surface and filling the contact holes.

In accordance with this invention, the above-understood hole fill method comprises the step of irradiating, after the film laying step, the covering film with plasma of inert gas ions to remove an aluminium oxide film formed on the covering film.

DESCRIPTION OF THE PREFERRED EMBODIMENTS

Figure 1:
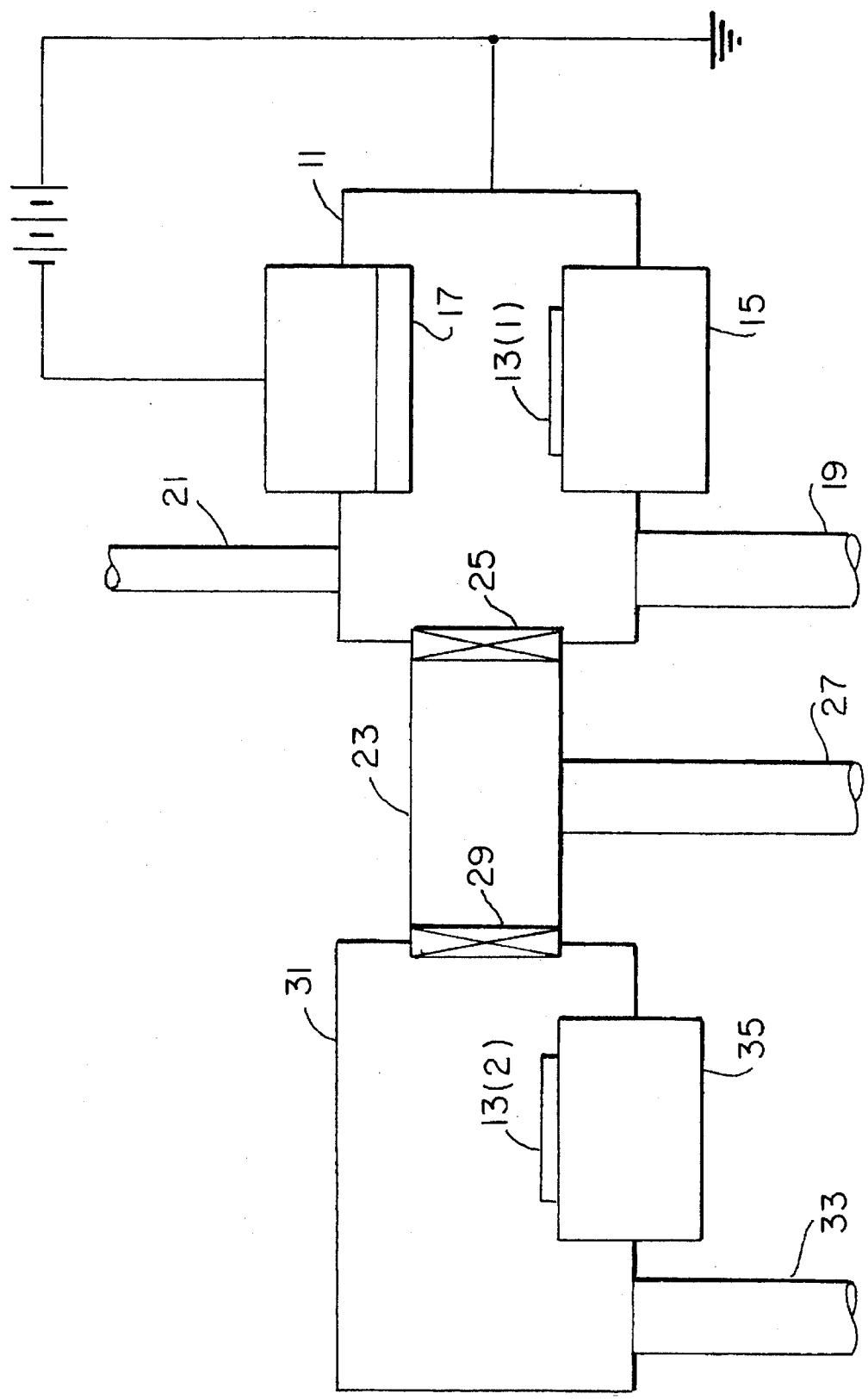
FIG. 1 schematically shows mainly in vertical section a side view of apparatus for implementing a conventional hole fill method.

Referring to FIG. 1, apparatus will first be described for implementing a conventional hole fill method disclosed in the Park et al. paper cited hereinabove. This conventional apparatus is described in order to facilitate an understanding of the present invention. Although the apparatus is not described in the Park et al. paper, it is believed that this illustration is correct.

The apparatus comprises a sputter chamber 11 in which a semiconductor wafer 13(1) is placed on a sputter chamber wafer support 15. Semiconductor devices are later manufactured with the wafer 13(1) used as their substrates. Each substrate 13(1) (the same reference numeral being used) is made typically of silicon and has a substrate surface.

In the manner which will later be illustrated, it is presumed that an interlayer isolation or insulation layer is already laid or spread on the substrate surface with an insulator material, as with BPSG (boron phosphate silicate glass), to a thickness of about 1 micron and has a principal surface directed topwardly of the figure. It is furthermore presumed that a plurality of contact holes are formed in the isolation layer in the manner known in the art. The contact holes are defined by sidewalls extended from the principal surface of the isolation layer bottomwardly of the figure and may have a common diameter of about 0.4 micron.

A sputter target 17 is put in the sputter chamber 11 with its surface directed to the principal surface of the isolation layer. The target 17 is made of a material consisting essentially of aluminium. The material may be a known aluminium alloy including small amounts of silicon and copper. Merely for convenience of the description, the material is herein referred to as a covering material.

It will be surmised in the known manner that a barrier metal film (later illustrated) is sputter deposited on the principal surface and on the sidewalls with a barrier metal to a thickness of about 0.1 micron. The barrier metal may be TiN/Ti (titanium nitride/titanium).

With the substrate or wafer 13 (1) placed on the wafer support 15, the sputter chamber 11 is evacuated through a sputter chamber exhaust pipe 19. After evacuation, argon gas is introduced into the sputter chamber 11 through a sputter chamber gas inlet tube 21 to fill the sputter chamber 11 with an argon gas atmosphere. In order to ionize the argon gas to obtain argon ions, an ionization voltage is supplied between a metal target support for the sputter target 17 and a metal wall of the sputter chamber 11. The sputter target 17 is bombarded by the argon ions to sputter deposit at room temperature a covering film (later illustrated) of the covering material on the barrier metal film to a thickness of about 0.5 micron. The substrate may now be called a covering-film covered substrate.

As will readily be understood, it is possible to sputter deposit the barrier metal film in the sputter chamber 11 before sputter deposition of the covering film on the wafer 13 (1) on which the isolation layer is already laid with the contact holes formed therein. In this event, the sputter target 17 should be made of the barrier metal and should subsequently be changed to one made of the covering material.

A transfer chamber 23 is connected to the sputter chamber 11 with an entrance gate valve 25 interposed. After the transfer chamber 23 is evacuated through a transfer chamber exhaust pipe 27, the entrance gate valve 25 is opened. The covered substrate is transferred from the sputter chamber 11 into the transfer chamber 23 by a transfer mechanism which is not depicted and is suited for use in vacuum. The ionization voltage is preliminarily switched off. The argon gas may beforehand be exhausted from the sputter chamber 11 with an argon gas reservoir (not shown) connected to the sputter chamber exhaust pipe 19. Alternatively, the argon gas may be exhausted from the sputter and the transfer chambers 11 and 23 with the gas reservoir connected to the transfer chamber exhaust pipe 27. The entrance gate valve 25 may be closed after the covered substrate is transferred therethrough.

With an exit gate valve 29 interposed, the transfer chamber 23 is connected to a reflow chamber 31. After the reflow chamber 31 is evacuated through a reflow chamber exhaust pipe 33, the exit gate valve 29 is opened. The covering-film covered substrate is transferred therethrough from the transfer chamber 23 into the reflow chamber 31 and is placed on a reflow chamber wafer support 35 as depicted at 13(2) by a transfer mechanism which is of the type described above and may be an extension of the transfer mechanism used between the sputter and the transfer chambers 11 and 23. The argon gas may be exhausted as a further alternative from the transfer and the reflow chambers 23 and 31 after the covered substrate 13(2) is put in place. The exit gate valve 29 is closed.

The reflow chamber wafer support 35 comprises a heater (not shown) for heating the covered substrate 13(2) placed thereon. When the covering film of the covered substrate is heated up to an aluminium reflow temperature between 450° C. and 480° C., aluminium of the covering material is caused to reflow into the contact holes. The covering film becomes a conductor film which will later be depicted to cover the principal surface and to fill the contact holes. In this manner, the wafer 13 (1) is processed into a conductor covered wafer, from which a plurality of semiconductor chips are manufactured in the known manner for manufacture of the semiconductor devices.

Reviewing FIG. 1, it should be noted that the wafer 13 (1) must be processed in two principal steps of forming the covering film and of causing reflow of aluminium of the covering material. If the wafer 13 (1) is subjected to these steps successively in a single processing chamber, it would take a long processing time in manufacturing the conductor covered wafer.

Use of two chambers 11 and 31 makes it possible to concurrently process two wafers with one processed as a wafer before processed 13 (1) and the other processed as a covering film covered wafer 13(2) (the same reference numeral being used). This makes it possible to achieve a raised throughput. The covering film covered wafer must, however, be transferred from the sputter chamber 11 to the reflow chamber 31 through the transfer chamber 23. During transfer, an aluminium oxide film (later illustrated) is unavoidably formed on an outside surface of the covering film even if the covered wafer is transferred either in vacuum or through the argon gas atmosphere. The aluminium oxide film is in practice an aluminium trioxide film or a natural oxide film and gives rise to the disadvantages discussed heretobefore.

Referring now to FIGS. 2 (A) through (D), the description will proceed to a hole fill method according to a first embodiment of the present invention. FIG. 3 will additionally be referred to, in which depicted is a novel apparatus for implementing the method under consideration.

In FIG. 3, similar parts are designated by like reference numerals and are similarly operable. The wafer 13 (1) before processed and the covering film covered wafer 13(2) are again illustrated. The reflow chamber 31 is additionally accompanied by a reflow chamber gas inlet tube 37. The reflow chamber wafer support 35 is connected to a high frequency (HF) oscillator 39 for generating oscillation frequency of 13.56 MHz.

After the reflow chamber 31 is evacuated, the covering-film covered wafer is transferred through the transfer chamber 23 into the reflow chamber 31 and is placed on the reflow chamber wafer support as a supported wafer 13(2). During the transfer, the aluminium oxide film is inevitably formed on the supported wafer 13(2). Argon gas is introduced into the reflow chamber 31 through the reflow chamber gas inlet tube 37 to bring an argon gas atmosphere of an argon pressure of 8 mTorr into contact with the support wafer 13(2), or more particularly, with the aluminium oxide film of the supported wafer 13(2).

Supplied between the covering film and a metal wall of the reflow chamber 31 through the reflow chamber wafer support 35 and through the supported wafer 13(2), the high frequency power generates plasma of argon ions in the argon gas atmosphere. The high frequency power furthermore gives a bias voltage of minus 300 volts to the covering film. The plasma irradiates the covering film. In other words, the aluminium oxide film is bombarded by the argon ions to be sputter etched away from the covering film. In addition, the plasma heats the covering film.

In the manner described in conjunction with FIG. 1, the heater is used to heat to 450° C. the covering film of the supported wafer 13(2). It will be surmised that the aluminium oxide film is already removed from the supported wafer 13(2). When the covering film is heated to this reflow temperature, aluminium of the covering material is caused to reflow into the contact holes.

It is possible to heat the covering film for reflow simultaneously with irradiation of the covering film with the plasma which is used also for removal of the aluminium oxide film. The argon gas may be exhausted from the reflow chamber 31 into the gas reservoir after the aluminium oxide film is removed either prior to the reflow or concurrently with the reflow.

Figure 2A:
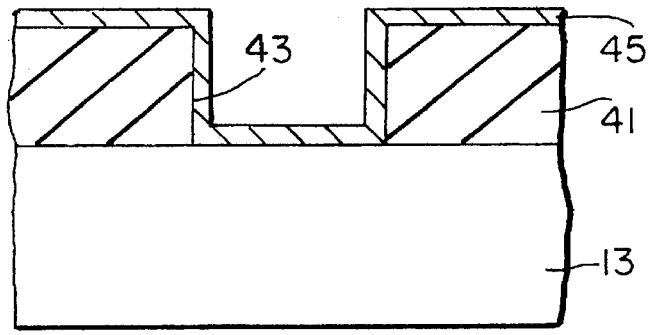
FIGS. 2 (A) through (D) show in schematic vertical sections a semiconductor chip during process of a hole fill method according to a first embodiment of the instant invention.
Figure 3:
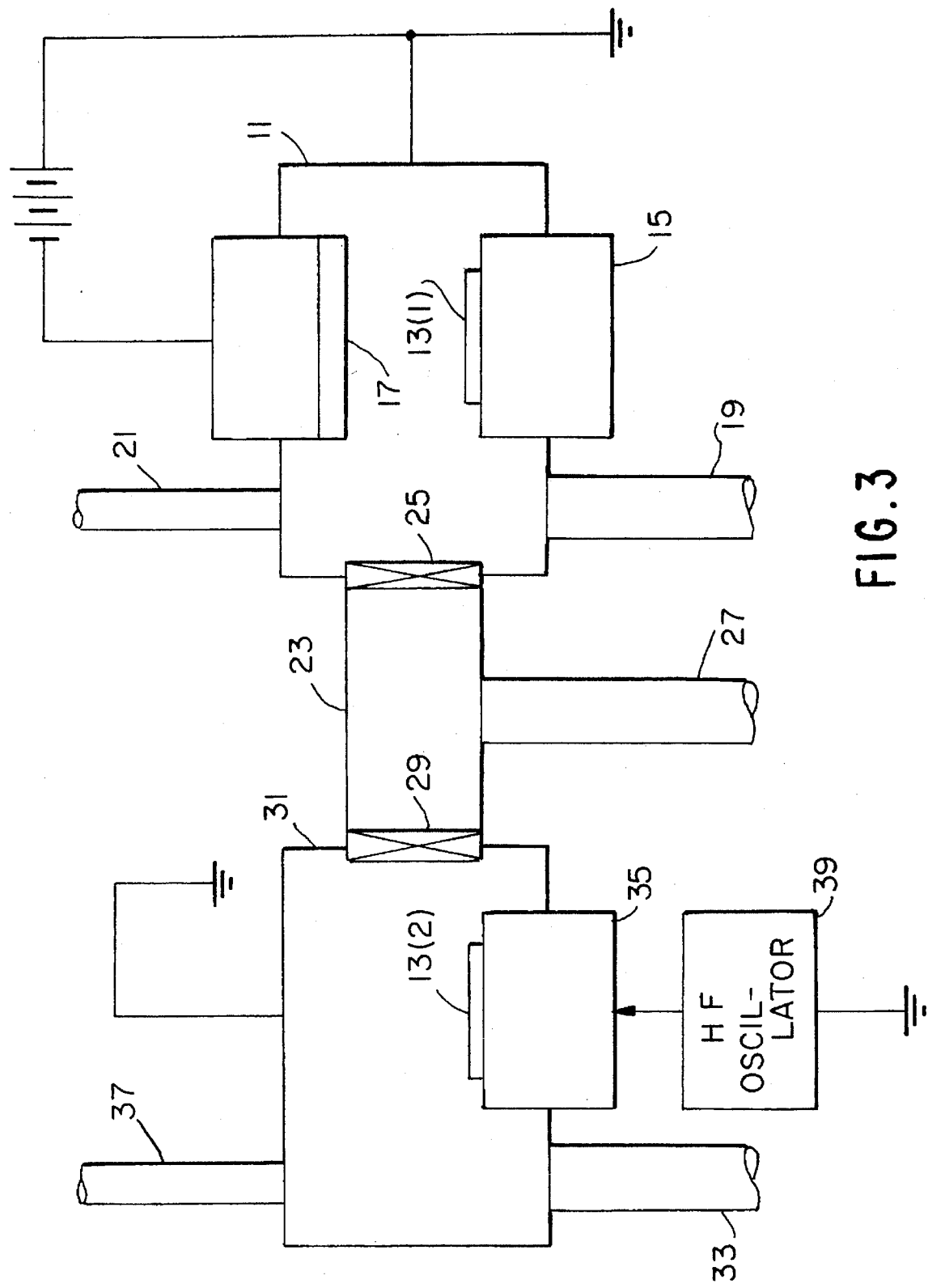
FIG. 3 schematically shows mainly in vertical section a side view of apparatus for implementing the hole fill method mentioned in conjunction with FIGS. 2 (A) through (D)

In FIG. 2(A), the wafer or the substrate is partly depicted. The wafer is a semiconductor substrate 13 in which a diffusion layer (not shown) of the semiconductor device is already formed. The interlayer isolation or insulation layer is illustrated at 41. One of the contact holes is shown at 43, which is defined by a cooperation of a sidewall extended from the principal surface into the isolation layer 41 and a bottom wall defined by an exposed surface portion of the substrate 13. The barrier metal film is formed as illustrated at 45 on the principal surface and on the sidewalls and the bottom walls of the contact holes 43.

Figure 2B:
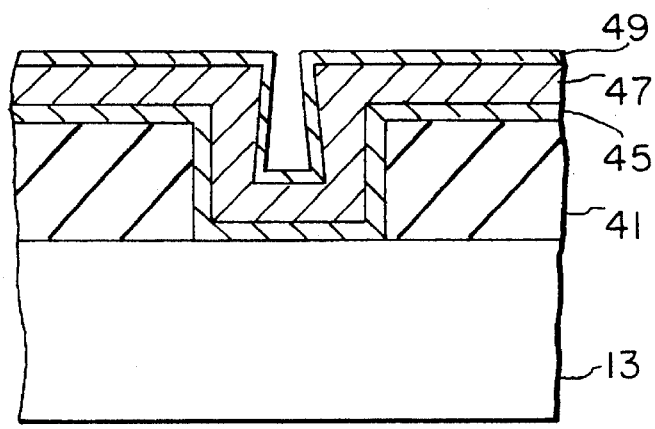
Figure 2C:
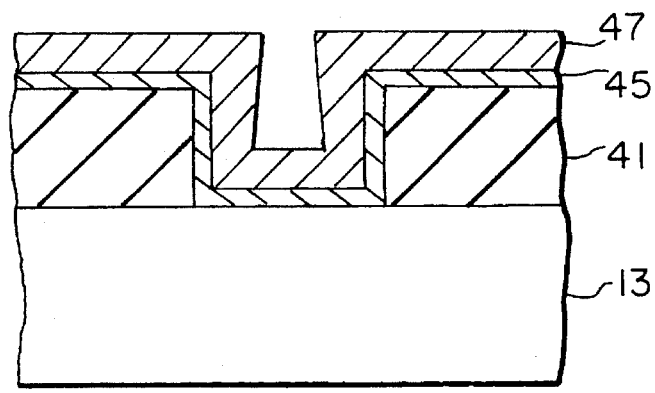
Figure 2D:
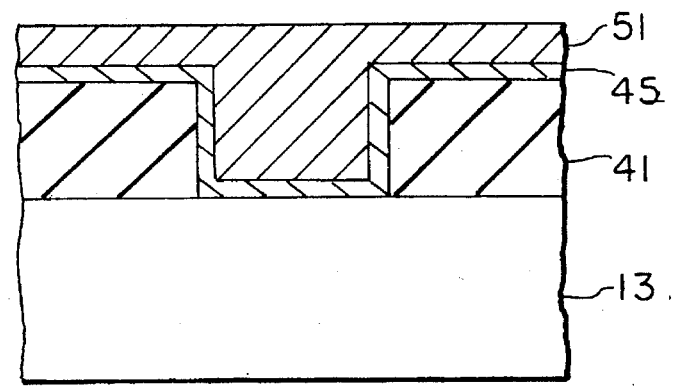

In FIG. 2(B), the covering film is sputter deposited as illustrated at 47 on the barrier metal film 45 in the sputter chamber 11 described in conjunction with FIG. 3. While the covering film covered wafer is transferred from the sputter chamber 11 into the reflow chamber 31 through the transfer chamber 23 and is put on the reflow chamber wafer support 35 as the supported wafer 13(2), the aluminium oxide film undesiredly grows as shown at 49 on the covering film 47 to a thickness of about 0.5 nanometer.

In FIGS. 2 (C) and (D), the aluminium oxide film 49 is sputter removed in about 10 seconds in the reflow chamber 31. The conductor film is depicted at 51 to cover the principal surface of the isolation layer 41 and to fill the contact holes, such as 43. The reflow becomes complete in 90 seconds. It has been confirmed that the conductor film 51 has an excellently planar or flat surface.

Figure 4:
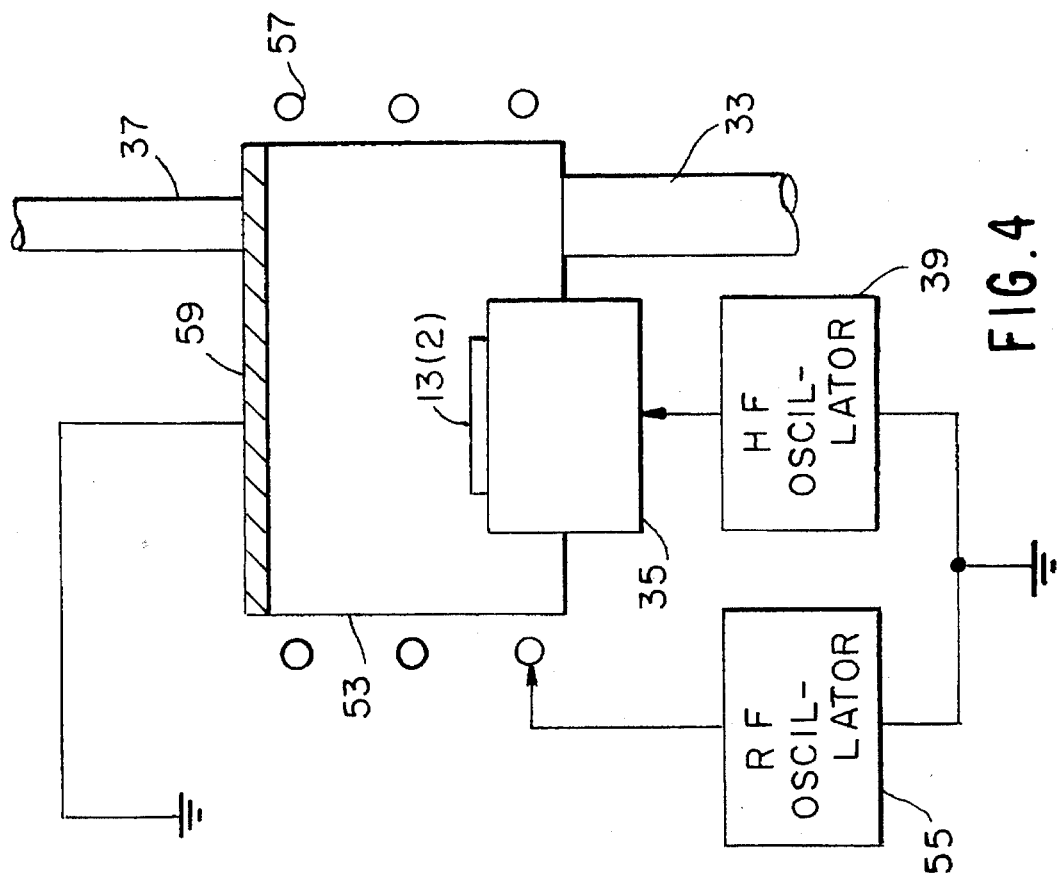
FIG. 4 schematically shows mainly in vertical section a partial side view of apparatus for implementing a hole fill method according to a second embodiment of this invention.

Referring to FIG. 4, a modified chamber 53 is for use as the reflow chamber 31 of the apparatus illustrated with reference to FIG. 3. Together with the sputter chamber 11 and others described in conjunction with FIG. 3, the modified chamber 53 is used in implementing a hole fill method according to a second embodiment of this invention.

The modified chamber 53 is accompanied by similar parts designated by like reference numerals. The reflow chamber wafer support 35 may or may not be accompanied by the heater described in connection with FIG. 3 and may be called a modified chamber wafer support 35 with the same reference numeral used.

In addition to the high frequency oscillator 39, a like radio frequency (RF) oscillator 55 is used. Furthermore, a radio frequency coil 57 is wound around a peripheral wall of the modified chamber 53, leaving unwound its peripheral part connected to the transfer chamber 23 through the exit gate valve 29 which are illustrated in FIG. 3 and are omitted from illustration in FIG. 4 merely for simplicity. A top wall of the modified chamber 53 is a metal wall 59 parallel to the supported wafer 13(2). The radio frequency oscillator 55 is for supplying the radio frequency coil 57 with radio frequency power of a radio oscillation frequency of 400 kHz. Under the circumstances, the argon pressure is 1 mTorr.

Referring back to FIGS. 2 (A) through (D) with additional reference to FIG. 4, the aluminium oxide film 49 is sputter removed concurrently with reflow of aluminium of the covering material. In other words, the irradiation step and the heating step are simultaneously carried out as follows.

Supplied with the radio frequency power, the radio frequency coil 57 generates plasma of argon ions in the argon gas atmosphere. The high frequency power gives the bias voltage to the supported wafer 13(2). Irradiated by the plasma or bombarded by the argon ions, the aluminium oxide film 49 is sputtered away. Concurrently, the covering film 47 of the supported wafer 13(2) is heated to the aluminium reflow temperature. This heating of the covering film 47 with the argon ion plasma is advantageous specifically in completely suppressing adverse effects which would otherwise be caused to the conductor film 51 when the covering film 47 is heated to 450° C. by heating the supported wafer 13(2).

Figure 5:
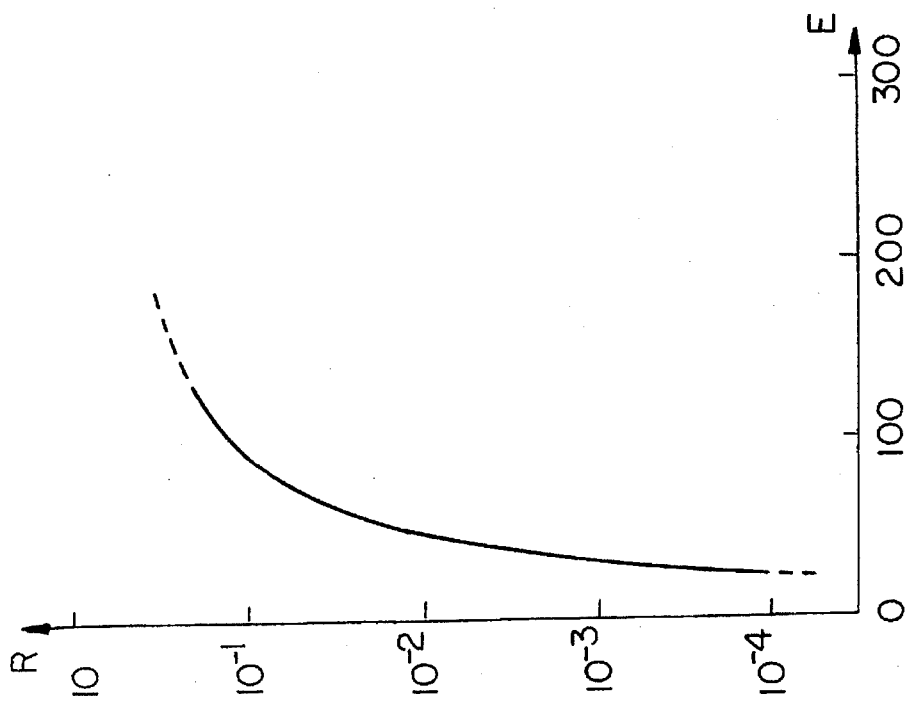
FIG. 5 exemplifies a characteristic curve for use in describing selection of ion energy used in the hole fill method mentioned in connection with FIG. 4.

Turning to FIG. 5 during a short while with FIGS. 2 (A) through (D) additionally referred to, a sputter rate R of a sputter target is exemplified in sputtered target atoms per argon ion versus argon ion energy E given to the argon ions in electron volts. It is clear from a curve illustrative of the sputter rate versus the argon ion energy that the covering film 47 or the conductor film 51 would be sputtered away at least partially from the supported wafer 13(2) if the argon ion energy is high. As a consequence, the argon ion energy should be low with the argon ions given a high argon ion density on using the irradiation step concurrently with removal of the aluminium oxide film 49 and for reflow of aluminium of the covering material to spread the conductor film 51.

More specifically, the sputter rate R is approximately proportional to a square of the argon ion energy E when the argon ion energy is below 100 electron volts. The argon ion plasma should preferably have the argon ion energy at which the sputter rate is between $10^{-2}$ and $10^{-3}$ aluminium atoms per argon ion. In this event, the argon ion energy should be between 30 and 50 electron volts.

Turning back to FIG. 4 and to FIGS. 2 (A) through (D), a combination of the radio frequency oscillator 55 and the radio frequency coil 57 serves as a plasma generating arrangement for generating the argon ion plasma in the argon gas atmosphere of 1 mTorr with this high argon ion density. It is possible to use electron cyclotron resonance (ECR) in the plasma generating arrangement in generating the argon ion plasma of this nature. Either the high frequency power or the electron cyclotron resonance gives the low argon ion energy to the argon ion bombarding first the aluminium oxide film 49 and subsequently the covering film 47 of the supported wafer 13(2).

Inasmuch as the covering film 47 is heated by bombardment thereon by the argon ions, aluminium of the covering material alone is heated up to the aluminium reflow temperature to fill the contact holes, such as 43, as hole filling aluminium masses. A combination of the hole filling aluminium masses and the semiconductor substrate 13 of the supported wafer 13(2) dissipates heat produced by irradiation with the argon ion plasma in the covering film 47 towards the modified chamber wafer support 35 to keep the substrate 13 at a sufficiently low temperature capable of preventing an adverse chemical reaction from taking place between each hole filling aluminium mass and the diffusion layer below the contact holes 43 through the barrier metal film 47 and between the conductor film 51 and the substrate 13.

Reviewing FIGS. 2 (A) through (D) and FIGS. 3 through 5, the aluminium oxide film 49 is irradiated by the argon ion plasma for removal either immediately before or simultaneously with reflow of aluminium of the covering material. The reflow is consequently thoroughly carried out to spread the conductor film 51. Concurrent irradiation of the aluminium oxide film 49 and heating of the supported wafer 13(2) by a heater described in conjunction with FIGS. 1 and 3 is desirable when it is desired to reduce the argon ion energy E. In this event, the covering film 47 of the supported wafer 13(2) is heated by the heater up to about 400° C.

As a result, it is possible to readily and completely fill the contact holes 43 with the conductor film 51 even if the contact holes 43 have a high aspect radio. Furthermore, it is possible to cause aluminium of the covering material to reflow with the semiconductor substrate 13 kept at an appreciably low temperature. This low temperature prevents impurities from being taken into the conductor film 51. Exempted from the impurities, the conductor film 51 is given a morphologically excellent planar or flat surface and is readily worked into the wirings. In addition, the alignment is excellent. Use of irradiation by the argon ion plasma on the covering film 47 can keep the semiconductor substrates 13 at the low temperature with only the covering film 47 heated to the aluminium reflow temperature. Preventing the adverse chemical reaction from being given rise to, the appreciably low temperature prevents junction leakage from taking place and insures a high reliability and much improved yield of the semiconductor devices. In FIGS. 2 (A) through (D), it is possible to lay a second isolation layer (not shown) for multilevel wiring on the conductor film 51 worked into the wirings. Attention should, however, be directed to avoidance of any disturbance which might be caused to the wirings on carrying out reflow of aluminium of the covering material of a second covering film (not shown) into contact holes (not shown) formed in the second isolation layer. Use of irradiation either solely or in combination with heating of the second covering film by the heater up to about 400° C. is effective in preventing the disturbance from taking place.

While this invention has thus far been described in specific conjunction with only two preferred embodiments thereof, it will now be readily possible for one skilled in the art to put this invention into effect in various other manners. For example, it is possible in general to use inert gas, such as neon gas, for generation of inert gas ion plasma. It is possible like in the conventional apparatus to sputter deposit the barrier metal film 45 on the isolation layer 41 with the sputter target 17 made of the barrier metal and subsequently to substitute therefor the target 17 of the covering material for sputter deposition of the covering film 47 on the barrier metal film 45. In consideration of the multilevel wiring described by reviewing FIGS. 2 (A) through (D) and FIGS. 3 through 5, it should be known that the isolation layer, such as 41, is laid either directly or indirectly on the semiconductor substrate 13.

What is claimed is:

1. A hole fill method of filling contact holes formed in an interlayer isolation layer laid on a substrate of a semiconductor device having a principal surface and sidewalls defining said contact holes, said hole fill method including steps of laying on said principal surface and on said sidewalls a covering film of a covering material consisting essentially of aluminum and of heating said covering film for reflow of aluminum of said covering material into said contact holes to spread a conductor film covering said principal surface and filing said contact holes, wherein said hole fill method comprises a step of irradiating, after said film laying step, said covering film with plasma of inert gas ions to remove an aluminum oxide film formed on said covering film, and wherein said inert gas ions have an energy below 100 electron volts and a density calculated to cause removal of said aluminum oxide film while avoiding incorporation of said inert gas ions into said covering film.

2. A hole fill method as claimed in claim 1, wherein said irradiating step is implemented by application of high frequency power to an inert gas atmosphere brought into contact with said aluminium oxide film.

3. A hole fill method as claimed in claim 1, wherein said irradiating step is implemented by application of electron cyclotron resonance to an inert gas atmosphere brought into contact with said aluminium oxide film.

4. A hole fill method as claimed in claim 1, wherein said irradiating step is carried out before said heating step.

5. A hole fill method as claimed in claim 1, wherein said irradiating step is carried out simultaneously with said heating step to heat said covering film by irradiation with said plasma for removal of said aluminium oxide film and for reflow of aluminium of said covering material.

6. A hole fill method as claimed in claim 1, wherein said irradiating step is carried out to set said ion energy between 30 and 50 electron volts.

7. A hole fill method as claimed in claim 1, wherein said heating step is implemented by said irradiating step after said film laying step.

8. A method of fabricating a semiconductor device comprising the steps of:

forming an insulating layer on a semiconductor substrate, said insulating layer having a contact hole exposing a part of said semiconductor substrate;

forming an aluminum layer over a surface of said insulating layer and said part of said semiconductor substrate; and irradiating plasma of inert gas ions for removing an oxide layer formed on said aluminum layer and for reflowing said aluminum layer to fill said contact hole by said aluminum layer, wherein said inert gas ions have energies between 30 and 50 electron volts and a density calculated to enable removal of said oxide layer while avoiding incorporation of said inert gas ions into said aluminum layer.

9. The method for fabricating a semiconductor device as claimed in claim 8, wherein said aluminium layer is heated by heater in the step of reflowing said aluminium layer to fill said contact hole.

10. The method for fabricating a semiconductor device as claimed in claim 9, wherein said aluminium layer is heated by irradiating plasma of inert gas ions in the step of reflowing said aluminium layer to fill said contact hole.

11. The method for fabricating a semiconductor device as claimed in claim 10, wherein inert gas ion energy is selected so that sputter rate is between $10^{-2}$ and $10^{-3}$ aluminium atoms per inert gas ion.

12. The method for fabricating a semiconductor device as claimed in claim 8, wherein a barrier metal layer is formed between said part of said semiconductor substrate and said aluminium layer.

* * * * *